(12) United States Patent
Sasaki

(10) Patent No.: US 6,218,856 B1
(45) Date of Patent: *Apr. 17, 2001

(54) HIGH SPEED PROGRAMMABLE LOGIC ARCHITECTURE

(75) Inventor: Paul T. Sasaki, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/731,369

(22) Filed: Oct. 11, 1996

Related U.S. Application Data

(63) Continuation of application No. 08/580,668, filed on Dec. 29, 1995, which is a continuation of application No. 08/188,499, filed on Jan. 27, 1994.

(51) Int. Cl.[7] ............................ H03K 19/177; G06F 7/38
(52) U.S. Cl. .................................................. 326/39; 326/41
(58) Field of Search ........................... 326/38–39, 41.47, 326/17–21, 56

(56) References Cited

U.S. PATENT DOCUMENTS

| | | |
|---|---|---|
| Re. 34,363 | 8/1993 | Freeman . |
| 4,706,216 | 11/1987 | Carter ..................................... 365/94 |
| 4,758,745 | 7/1988 | Elgamal et al. . |
| 4,855,619 | 8/1989 | Hsieh et al. . |
| 4,987,319 | 1/1991 | Kawana . |
| 5,017,813 | 5/1991 | Galbraith et al. . |
| 5,144,166 | 9/1992 | Camarota et al. . |
| 5,204,556 | * 4/1993 | Shankar .................................. 326/38 |
| 5,208,491 | 5/1993 | Ebeling et al. . |
| 5,256,918 | 10/1993 | Suzuki . |
| 5,260,881 | 11/1993 | Agrawal et al. ..................... 364/489 |
| 5,327,023 | 7/1994 | Kawana et al. . |
| 5,369,314 | 11/1994 | Patel et al. ............................ 326/13 |
| 5,504,440 | * 4/1996 | Sasaki .................................. 326/39 |
| 5,742,179 | * 4/1998 | Sasaki .................................. 326/39 |

* cited by examiner

Primary Examiner—Michael Tokar
Assistant Examiner—Steven S. Paik

(57) ABSTRACT

Architecture for a programmable logic device is described which can operate at substantially faster clock rates than present programmable logic devices. Instead of employing passive circuit elements to interconnect the programmable logic elements and the input and output data buses, controllable active driver circuits are employed. These circuits eliminate essentially all of the resistance present in prior art passive connections.

4 Claims, 9 Drawing Sheets

HIGH SPEED PROGRAMMABLE LOGIC ARCHITECTURE

CROSS REFERENCE TO RELATED APPLICATIONS

This application is a continuation of U.S. patent application Ser. No. 08/580,668, filed Dec. 29, 1995; which was a continuation of U.S. patent application Ser. No. 08/188,499, filed Jan. 27, 1994.

BACKGROUND OF THE INVENTION

This invention relates to programmable logic, and in particular to a high speed programmable logic device architecture, employing active driver circuits in the interconnection array.

A programmable logic device (PLD) is a programmable integrated circuit that allows the user of the circuit, using software control to customize the logic functions the circuit will perform. The logic functions previously performed by small, medium, and large scale integration integrated circuits are now capable of being performed by programmable logic devices. PLDs now have a capacity on the order of 50,000 gates per integrated circuit. When a typical programmable logic device is supplied by an integrated circuit manufacturer, it is not yet capable of performing any specific function. The user, however, in conjunction with software, also typically supplied by the programmable logic device manufacturer, can program the PLD to perform the specific function or functions required by the user's application. The PLD then can function in a larger system designed by the user, just as though dedicated logic chips were employed. This functionality allows the user to debug the system logic without committing the time or expense of custom chips or gate arrays. It also allows small production runs, and the customization of hardware to suit a very specific application. In some PLD's the logic can be changed "on-the-fly" enabling the PLD to perform one function at one time during system operation, and another function at a later time.

A typical PLD consists of an array of identical logic cells that can be individually programmed, and which can be arbitrarily interconnected to each other to provide internal input and output signals, thus permitting the performance of implemented in the PLD by setting the states of programmable elements such as memory cells.

One type of programmable logic, known as programmable logic arrays (PLA) is a combinatorial two-level AND/OR integrated circuit which can be programmed to perform sum-of-products logic. Such devices typically consist of a series of AND gates having input terminals which can be programmably connected to chip input signals, and a series of OR gates which may be programmably connected to receive the output signals from the AND gates.

Another type of programmable logic device is known as programmable array logic (PAL). PALs use a fixed OR array and bidirectional input/output pins. A disadvantage of both PALs and PLAs is the lack of density with which they may be programmed. In other words, although the array is capable of performing many logic functions, utilization of the array is not as complete as desirable. Furthermore the size of the array increases faster than its programming capability.

A response to this problem has been the provision of "macrocells" or logic blocks in programmable logic devices. A macrocell or logic block is a small grouping of logic capable of performing many different functions, and being selectively interconnectable to other macrocells or logic blocks. This allows the logic in the programmable logic device to assume a more granular structure in which pieces of the logic communicate with other pieces, to provide an overall more efficient utilization of the integrated circuit. Herein I use the phrase "programmable logic device" to refer collectively to programmable array logic, programmable logic arrays, field programmable gate arrays, and other types of programmable logic devices.

A significant disadvantage of all programmable logic devices presently available is their relatively slow speed. In all of the programmable logic devices described above, the connections within the AND and OR arrays, as well as to and from the macrocells, are made with erasable programmable read only memory cells, electrically erasable read only memory cells, static random access memory cells, fuses, or antifuses, or the like. In each of these cases, the interconnection approach is passive. That is, the state of a memory cell or fusible connection is itself used to control some other apparatus which makes or breaks a connection between two nodes.

All of these connections are passive in the sense that the signals presented to the connection simply pass through the connection (or do not pass if the connection is open). As a result, the overall speed of the programmable logic device is limited for reasons discussed below. Even the fastest prior art large field programmable gate arrays presently available operate at 50 mhz or slower. Some small transistor-transistor logic (TTL) devices can operate at over 100 megahertz. No one is presently manufacturing large fast arrays.

One of the primary reasons for the relatively slow operating speed of prior art programmable logic devices is the resistance present in the interconnection system. The interconnection system is the programmable "wiring" by which the logic signals are propagated across the integrated circuit chip. This propagation speed is limited by the series resistance of the transfer gates employed, whether formed as EPROM cells, SRAM cells, antifuses, or otherwise. As a result, manufacturers of prior art programmable logic devices have been forced to chose between resistance and capacitance in the technology selection for their transfer gates.

As described above, in a typical prior art programmable logic device, the logic is implemented in logic blocks which communicate with each other. Such logic blocks when coupled with transfer gates have an effective drive resistance on the order of 1000 ohms per connection plus the resistance of the driver circuit. In antifuse technology, for example, as implemented by Actel Corporation, the effective drive resistance is on the order of 50 to 500 ohms per connection plus the resistance of the driver circuit. As will be described, in the technology of our system, the effective drive resistance is simply the resistance of the driver circuit.

SUMMARY OF THE INVENTION

We have developed an architecture for programmable logic devices which is capable of operating at substantially greater speeds than prior art programmable logic devices. In a preferred embodiment of our system, speeds of up to 500 mHz are achievable using the programmable logic techniques of our system and presently available silicon semiconductor technology.

In one implementation of our invention, a routing structure is provided for a programmable logic circuit which includes logic cells in which logic functions are performed. The routing structure includes a set of input lines generally extending in a first direction for supplying signals to be processed by the logic cells, and a set of output lines extending in a different direction for receiving signals which have been processed by the logic cells. Where the input and output lines cross, junction regions are established which include controllable active driver circuits which are capable of programmably providing, or not providing, connections between selected ones of the set of output lines and selected ones of the set of input lines to enable signals present on the output lines to be placed on desired ones of the input lines. Each of the controllable driver circuits is a buffer circuit capable of being placed in at least an active state in which the driver circuit replicates a signal supplied to it, or in a passive state in which it presents a high impedance between its input and output. Typically, the controllable driver circuits enable each output line in the set to be connected to any desired ones in the set of input lines.

In another embodiment, our system includes a similar structure to that described immediately above, but in addition provides a set of controllable driver circuits to selectively interconnect desired ones of the input lines and the output lines to the logic cells. In this manner, input signals present on the input lines can be supplied to the appropriate nodes of the logic cell, and output signals from the logic cells can be supplied to other desired logic cells or other circuitry.

In conjunction with our system, controllable driver circuits may also be employed in the interface circuit between the integrated circuit pins and the sets of input and output lines. The controllable driver circuits allow desired connections between the pins of the integrated circuit and the input and output buses, thereby enabling desired signals presented at the chip pins to be supplied to appropriate logic cells, and the output from those logic cells to be applied to appropriate pins, as well.

The use of active circuits, such as the controllable driver circuit described herein, enables the programmable logic device of our system to operate substantially faster than prior art devices. Using 1993 semiconductor technology, in the prior art, 50 mHz represents an upper limit for the clock speed at which a programmable logic device can operate. Programmable logic devices fabricated using the techniques of our invention can operate at up to 500 mHz.

DESCRIPTION OF THE SPECIFIC EMBODIMENTS

Figure 1:
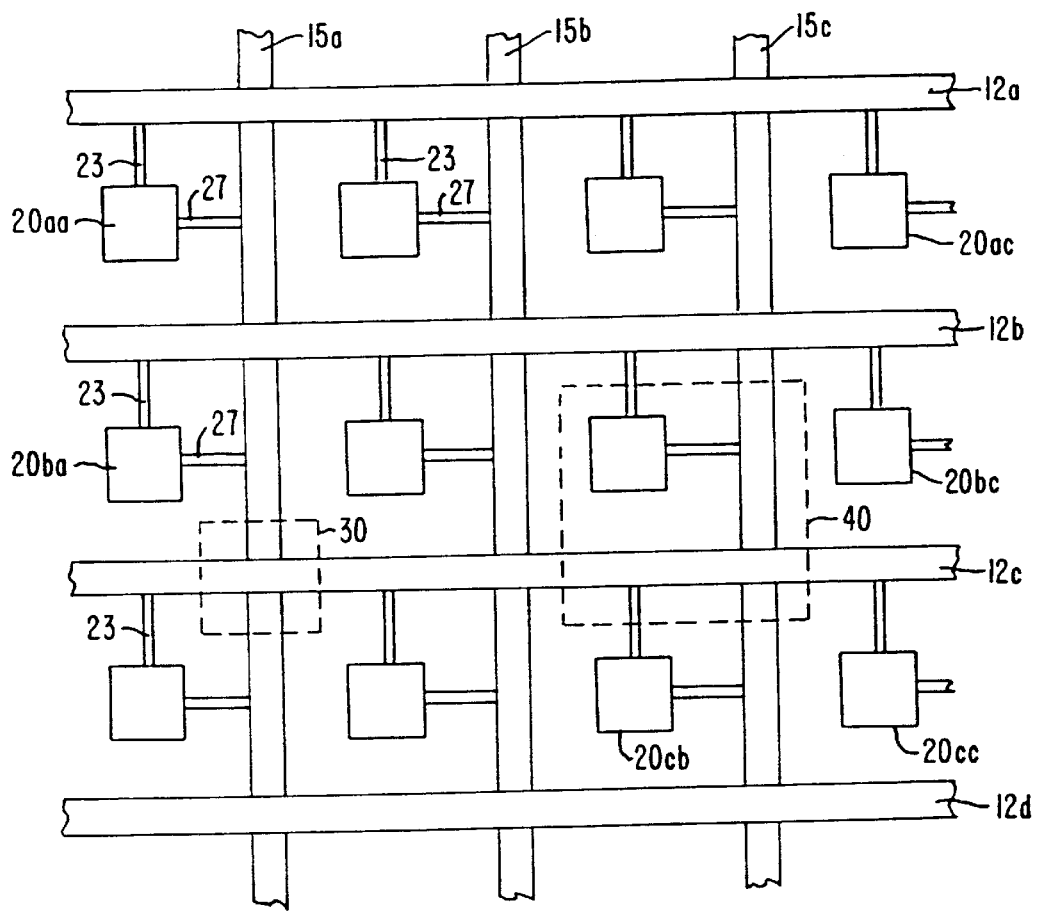
FIG. 1 is a block diagram showing an overall layout of an integrated circuit employing the programmable logic device architecture of our invention.

FIG. 1 is a block diagram illustrating the overall layout of a high speed programmable logic device fabricated according to a preferred embodiment of our invention. As shown in FIG. 1, the device includes a first set of routing channels 12 disposed generally in an east/west orientation, a second set of routing channels 15 disposed generally in a north/south orientation, and a series of logic cells 20 disposed within the matrix of routing channels.

In the conventional manner of programmable logic device operation, the routing channels contain buses of conductors for supplying input signals to the logic cells, and receiving output signals therefrom. Often, the output signals from a logic cell are used as the input signals to another logic cell.

As is well known, each logic cell can perform any desired logical operation, either combinatorial or sequential, or both, upon the input signals supplied to it. The particular logic function performed by a logic cell depends upon its program state, which is typically "loaded" into the cell using external circuitry. The state is defined using control bits from the external apparatus to set multiplexers, flip-flops, gates, etc.

In the general block diagram of FIG. 1, the logic cells 20 receive input signals from buses 12, and supply output signals onto the buses 15. The input signals are transmitted from the bus and supplied to the logic cell by conductors 23, and the resulting output signals are supplied to the output buses 15 using conductors 27. As will be explained, these conductors themselves are programmable in the sense that the input nodes of the logic cells may either be connected to, or disconnected from, selected lines in the input data bus 12. Of course, as mentioned, the input data bus itself may carry as signals output information from other logic cells.

Connections between the input and output data buses may be made in location 30, where these buses cross each other. Although the buses are depicted as crossing each other in the drawing of FIG. 1, in actual practice they are formed using different levels of metal or other conductive material on an integrated circuit, and are electrically isolated from each other unless an electrical connection between them has been "programmed." The manner in which the conductors may be coupled to each other in the crossing regions 30 is described further below.

An advantage of the structure of our invention is that it is modular. As shown within dashed line 40, in the preferred embodiment of our invention, essentially all of the integrated circuit area is consumed using regular modules 40 which include the interconnecting buses 12 and 15, the logic cell 20, and the buses 23 and 27 to provide signals to, and receive signals from, the logic cell. This modular structure facilitates an efficient layout of the integrated circuit.

Thus, as shown, each output of a logic cell extends for the entire vertical span of the chip layout. The output buses extend along only one side of the logic cell, and stop at the chip edges. The input buses, however, "wrap-around" at the periphery of the integrated circuit. For example, buses 12a and 12b will be connected together at the east end or the west end of the circuit. In this manner, the input buses extend in a serpentine fashion across the surface of the entire circuit. Thus, bus 12a will be connected to bus 12b at either the eastern edge or the western edge of the chip, then bus 12b coupled to bus 12c at the opposite edge, etc.

The input and output buses are preferably unidirectional. For example, in an emitter-coupled logic (ECL) implementation, or in a complementary MOS (CMOS) implementation, the buses will be unidirectional over the shortest segments, but can be made bidirectional in different segments of a common bus by isolating the segments from each other as will be described. Depending upon the length of the buses, the input/output signal strength, and other factors, it may be desirable to employ "repeaters" within the buses. These repeaters consist of small amplifiers to isolate the capacitances in the circuit, and thereby decrease signal propagation delays, enhancing overall system speed.

Figure 2:
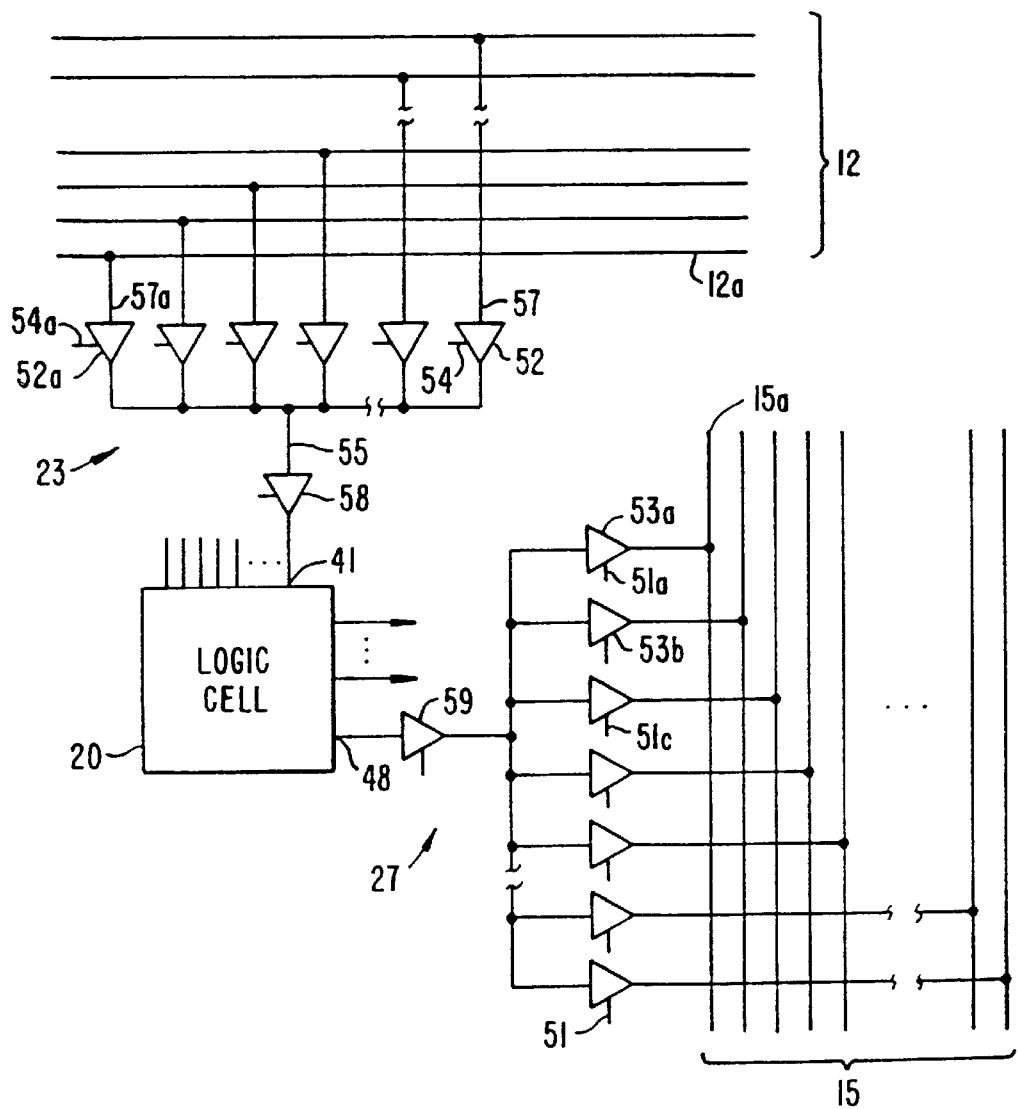
FIG. 2 is a schematic diagram illustrating the manner in which input signals are supplied to, and output signals are received from, the logic cell of our invention.

FIG. 2 is a more detailed view of the interconnection system between a logic cell 20 and its input bus 23, and between the logic cell 20 and its output bus 27. It should be appreciated that any desired number of inputs and outputs may be provided to and from a logic cell. The drawing in FIG. 2 illustrates the general approach to forming these interconnections and programmably controlling the connections.

As shown in FIG. 2, an input bus 12 has a series of conductors which may be selectively connected to an input node 41 of the logic cell using controllable driver circuits 52 and 58. Although the drawing depicts each conducting line in the bus 12 as being separately connectable to the input node 41, this is only for the purpose of illustration. In actual implementations of our circuit, each input node need not be connected to every line on the bus, as will become apparent in conjunction with a discussion of the fabrication of the logic cell below.

In any event, in the drawing each bus line in bus 12 is separately connected through a driver circuit. The driver circuit functions as a programmable three state buffer operating under control of an input signal supplied to it on line 54. Line 54 is coupled to a register or other means within which the program for controlling the overall programmable logic device is stored. A separate bit in this register, memory, a fuse or other means, is used to control a corresponding one of the programmable connections in the drawing in FIG. 2. Other bits are used to control other programmable connections elsewhere in the programmable logic device. Thus the control memory typically will have as many bits stored therein as there are programmable connections to be controlled. Of course, where two configurations are mutually exclusive and one, and only one, is always provided, the complementary state of a single bit can control two configurations. Under control of the memory bit, circuit 52a is either active or in a high impedance state. When the input 54a is enabled, circuit 52a repeats the signal coupled to its input node 57a. In other words, if a logical 1 is present on conductor 12a of bus 12, then input node 57a of driver 52a will be a logical 1. Assuming that control line 54a is enabled, then the output from driver 52a will also be a logical 1. Of course, the same conditions apply if a logical 0 is present on conductor 12a. Each of the drivers 52 functions in the same manner.

On the other hand, if control line 54 is not enabled, then the driver circuits present a high impedance state and functionally behave as an open circuit. In other words, node 55 is completely disconnected from bus 12. This allows an input node 41 to be disconnected from the bus 12 when that input node is not to receive signals from bus 12.

In some embodiments of our invention, another driver circuit 58 is provided between node 55 and node 41. This additional circuit can be employed to help reduce the capacitive loading on the input node 41. Although not shown in FIG. 2, each of the other input nodes to the logic cell 20 is similarly coupled to the input signal bus 12.

The output signal bus 15 is coupled to the logic cell 20 using a similar technique. As shown, the logic cell provides an output node 48 which is supplied to an optional driver circuit 59. Circuit 59 is provided for the same reasons as circuit 58, that is, to reduce the capacitive loading and drive circuit requirements on the logic cell. For logic cells with output drive power sufficient to drive a large capacitance, driver circuit 59 is unnecessary.

The output from circuit 59 is coupled to the input of driver circuits 53, each of which operates under program control using information supplied on a corresponding line 51. Line 51 may be connected to a single shift register element, memory cell or other storage. Controllable driver circuits 53 function in the same manner as circuits 52, that is, they either drive the corresponding output bus line with the signal presented at their input node, or present a high impedance condition to the output bus. In the high impedance state, signals supplied by the logic cell are prevented from influencing the state of the particular bus conductor. Thus, the overall output connections 27 (as shown in FIG. 1) are the reverse of the input connections 23 (shown in FIG. 1).

In another embodiment of this invention, the circuits 52, 53, 58, and 59 can be replaced with multiplexers. In this case the control lines 51 and 54 supply control signals to select among the multiplexer input lines, connecting the appropriate one to the logic cell.

Figure 3:
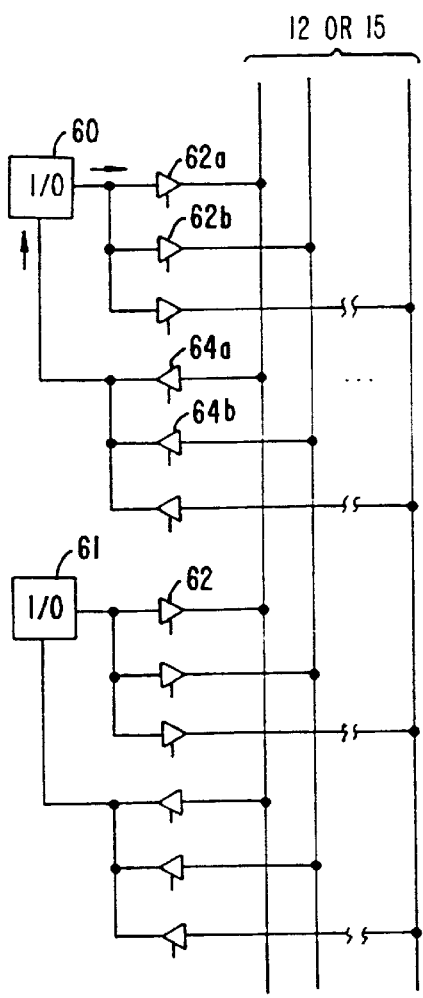
FIG. 3 is a schematic illustrating one embodiment of a circuit for interconnecting the integrated circuit input/output pins with the input/output buses.

FIG. 3 illustrates the routing structure of the preferred embodiment of our programmable logic device in further detail. Shown in FIG. 3 is the manner in which signals presented at the input/output pins of the integrated circuit are supplied to and received from the interconnecting input and output buses of the programmable logic device. As shown in FIG. 3, two example I/O pins 60, 61 are connected, again through circuits 62, to the input/output buses 12 or 15. Although the drawing is shown with the bus extending in a north/south direction, it should be appreciated that the circuitry depicted can perform the same function whether the bus is an input bus 12 or an output bus 15. Furthermore, each input/output pad 60 can be coupled to both input and output buses by simply repeating the structure shown in FIG. 3. Thus, the input connection 60 is connectable through driver circuits 62a, 62b, . . . , to any one of the lines 12. This allows an input signal presented at pad 60 to be placed on the bus 12 for supply to any one of the logic cells on the integrated circuit. Similarly, output driver circuits 64a, 64b, etc., allow signals present on the bus to be communicated from the bus to the output pad. As mentioned above, although the structure depicted illustrates only the output bus, the entire structure of FIG. 3 can be repeated to allow connections to the input buses. Of course, as many input and output pins as desired may be used.

Figure 4:
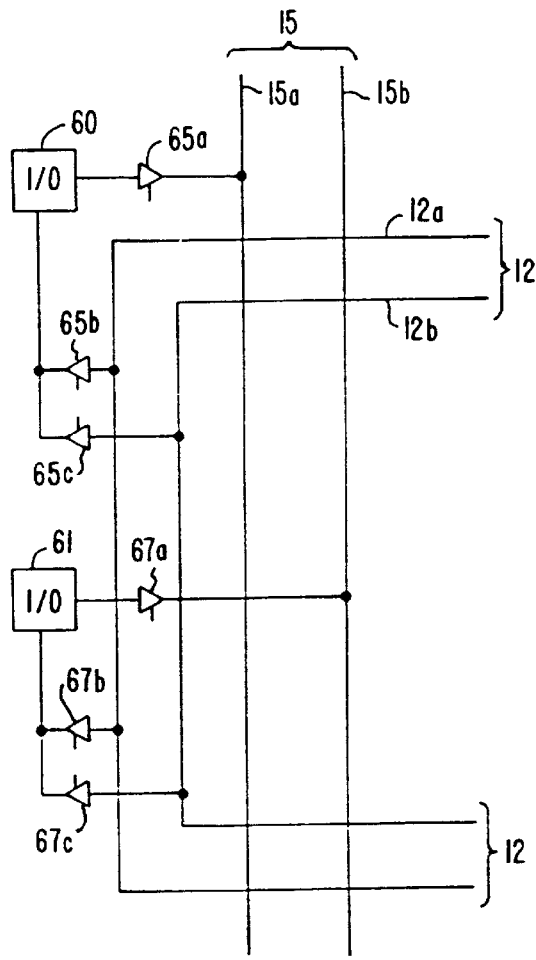
FIG. 4 illustrates another embodiment of a circuit for interconnecting the integrated circuit input/output pins with the input/output buses.

FIG. 4 is a diagram illustrating an alternative approach to the interconnections between the input/output pads and the buses. As shown in FIG. 4, the input buses 12a and 12b extend in a serpentine manner past the input/output pads 60, 61. In contrast the output buses 15a, 15b extend vertically past the I/O pads. I/O pad 60 is selectively connectable to output bus 15a using programmable driver 65a. It is also selectively connectable to bus 12a via driver 65b and bus 12b via driver 65c. In a similar manner, input/output pad 61 can be connected to drive output bus 15b with driver 67a, and can be connected to receive signals from either bus line 12a or bus line 12b using driver 67b and 67c, respectively. In this configuration the inputs behave like cell outputs and become part of bus 15 viewed differently, and input pad to the chip can be considered as the output from an external source off the chip.

Figure 5:
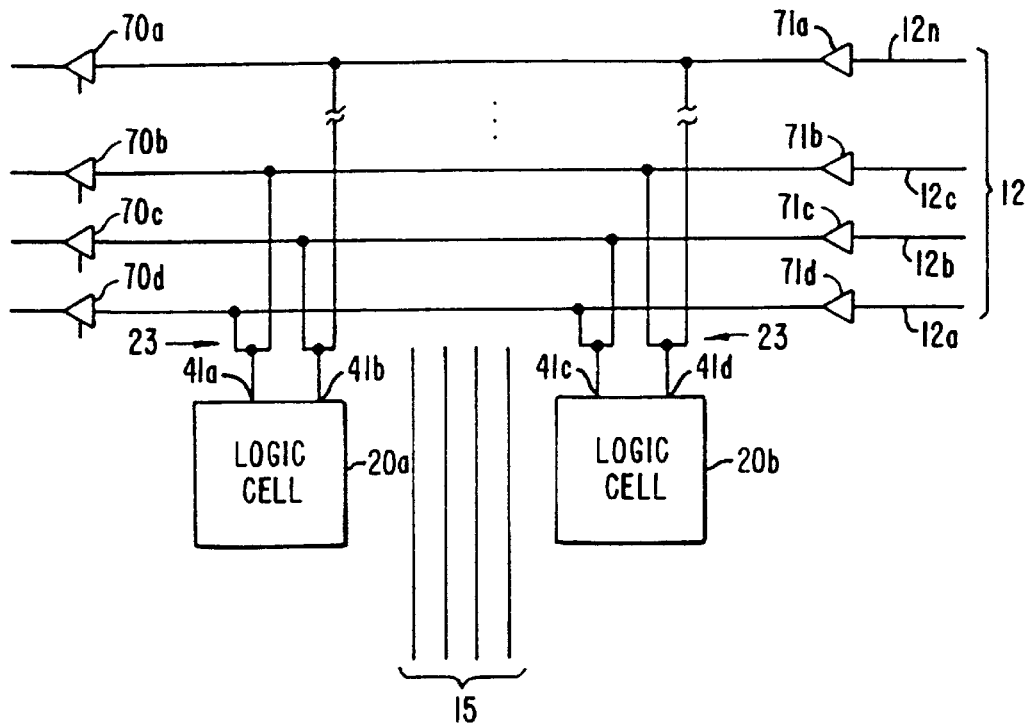
FIG. 5 illustrates how driver circuits may be employed in the input or output buses, together with a technique for lowering the number of interconnections between the logic cells and such buses.

FIG. 5 illustrates another aspect of the input and output buses of our system. As shown in FIG. 5, bus 12, for example an input bus, extends across the upper portion of the figure. Input bus 12 is coupled to logic cells 20 using the same techniques as shown in FIG. 2. For simplicity, however, the driver circuits in the local bus 23 between the input bus 12 and the logic cells 20 are not shown. These are provided in the manner described above.

Also, for illustration, the input terminals 41 to the logic cell 20 are shown as not being connectable to all lines of the input bus 12. Although it may seem desirable to provide a connection between every input line and every input node of every logic cell, in practice this is unnecessary. A more efficient design can be achieved by simply providing sets and subsets of connections between the bus and the logic cell. For example, logic cell 20a is shown as having an input node 41a connectable to bus lines 12a and 12c, and an input node 41b connectable to bus lines 12b and 12n. In contrast, logic cell 20b has input nodes 41c connectable to bus lines 12a and 12b, while node 41d is connectable to bus lines 12c and 12n. Thus, if a logic function were to be performed using as input signals to logic cell 20, only the data on lines 12a and 12b, then logic cell 20a would be employed for that function (and would be selected by the software for that task). By employing logic cell 20a, input 41a of the cell can receive the input signal on line 12a, while input 41b can receive the input signal on line 12b.

Another feature of our system shown in FIG. 5 is the use of controllable driver circuits in the bus lines themselves. If the bus lines are allowed to extend in the serpentine manner across the surface of the entire chip without interruption, a very high capacitance load is placed on the cell output drivers. This high capacitance requires the drivers for driving the input signal to consume extra power and operate undesirably slowly. To overcome this problem, we provide driver circuits 70 at selected intervals along the bus lines. Although depicted in conjunction with an input bus 12, the same technique is employed in the output bus 15.

In FIG. 5, these driver circuits are shown as being disposed every two logic cells along the bus. The actual number of driver circuits in a particular design is determined by space, speed, and flexibility tradeoffs.

For the embodiment depicted in FIG. 5, some of the driver circuits 70 have been made programmable, while other circuits 71 are not programmable. Circuits 71 are provided in an always ON condition. In other words, whatever signal is provided at their input node is reproduced at their output node.

Circuits 70, however, are made programmably controllable, and can employ the same circuitry as the controllable driver circuits. Each of circuits 70 is similar to the circuits discussed above, for example driver circuits 52 and 53 in FIG. 2. The capability of placing the circuits in high impedance condition allows the input bus (or the output bus) to be divided into smaller "pieces." For example, if the function of bus line 12a is only to provide an input signal to node 41a in logic cell 20a, driver circuits 70d may be turned OFF. This eliminates the need for whatever driving circuit is driving bus line 12a to drive the extra capacitance of that bus line beyond driver circuit 70d. Furthermore, it allows that portion of the bus line 12a beyond driver circuit 70d to be utilized for other purposes, for example, to function as a "local" connection between two logic cells.

Figure 6:
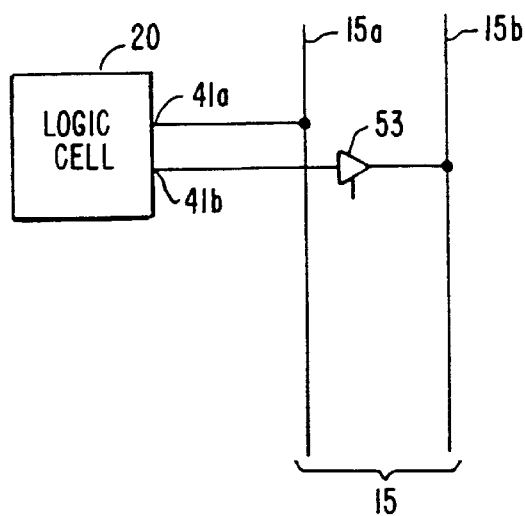
FIG. 6 illustrates another technique for reducing the number of connections.

FIG. 6 illustrates a further refinement of the routing structure of our system. As shown in FIG. 6, some output nodes 41a from the logic cell 20 can provide dedicated connections to the output bus line 15a. At the same time, other connections from the logic cell, for example output 41b, can provide controllable or programmable connections to the output bus line 15b using a controllable driver circuit 53. This eliminates unnecessary driver circuits, and allows optimizing the design to suit a class of logical functions to be provided. In a typical implementation of our system, some connections will be attached without driver circuits, as shown in node 41a, while others will use a programmable connection, as shown for node 41b.

Figure 7:
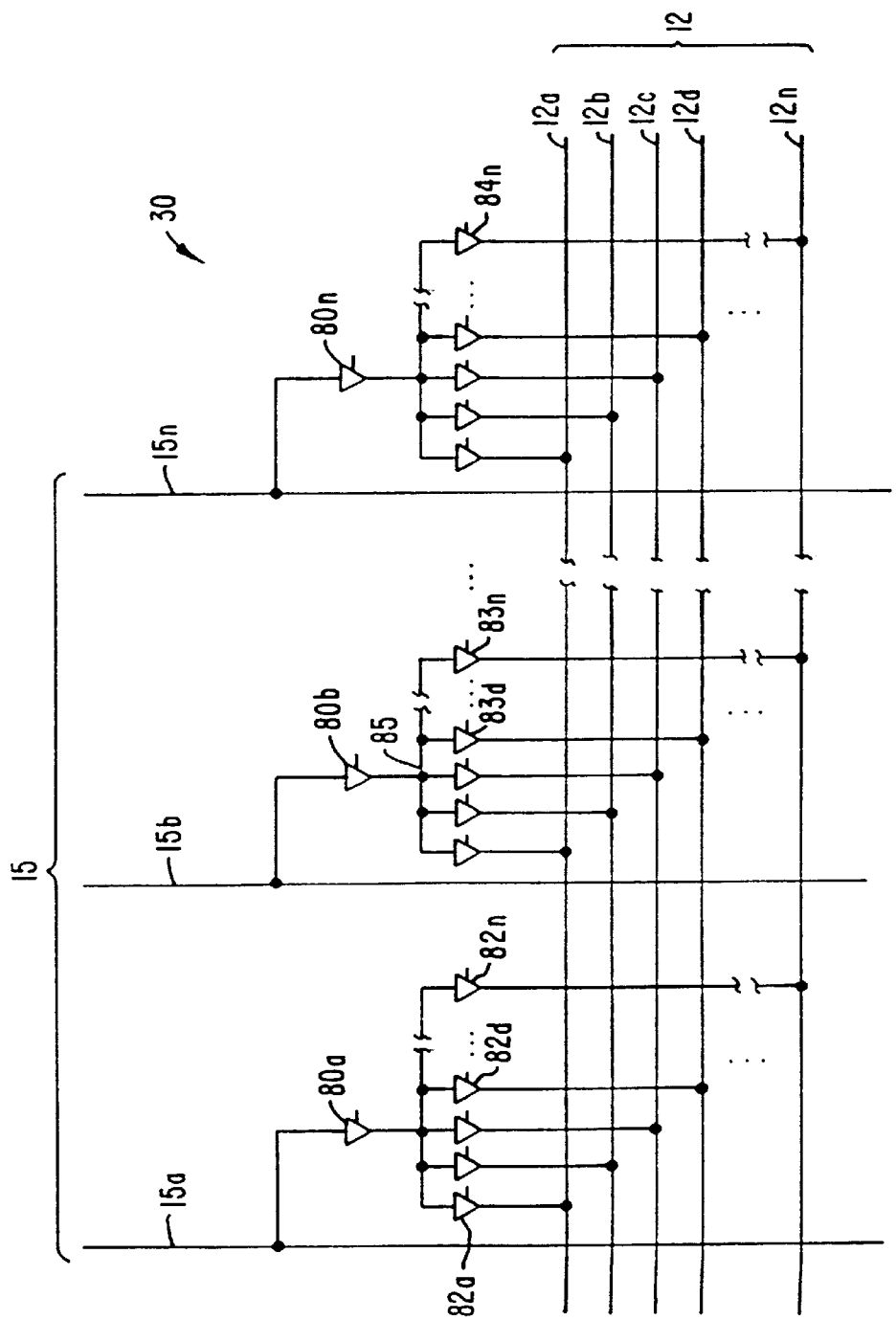
FIG. 7 is a schematic drawing of circuitry which may be employed to provide interconnections between the input and output buses, for example, at locations where they cross.

FIG. 7 is a diagram illustrating a more detailed view of the bus interconnection region 30 shown in FIG. 1. The drawing illustrates three of the output bus lines 15a, 15b, and 15n, and five of the input bus lines 12a, 12b, 12c, 12d, and 12n. Programmable driver circuits, like those described above, enable the connection of any output bus to any input bus. For example, assume that it is desired to supply the output information on bus line 15b to input bus 12d. To achieve this, circuit 80b will be programmed ON, thereby replicating the state of bus 15b at node 85. In addition, circuit 83d will be programmed ON, to pass the state of node 85 to input bus 12d. All other programmable driver circuits 83 will be programmed OFF in their high impedance state to prevent the information on node 85 from being placed on any of the other bus lines.

For illustration, also assume output bus line 15a is not to be coupled to any of the input bus lines 12a, 12b, ..., 12n. To achieve this, circuit 80a will be programmed OFF, as well as all circuits 82. This will isolate output bus 15a from input buses 12. In this manner, any desired output bus can be coupled to any desired input bus.

Figure 8A:
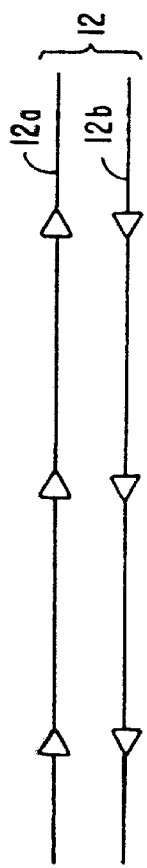
FIG. 8a illustrates two unidirectional bus lines.
Figure 8B:
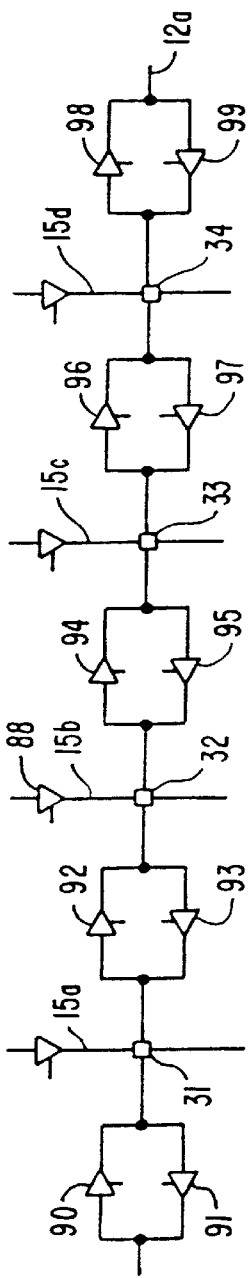
FIG. 8b illustrates a bus line which can be made unidirectional in either direction.
Figure 8C:
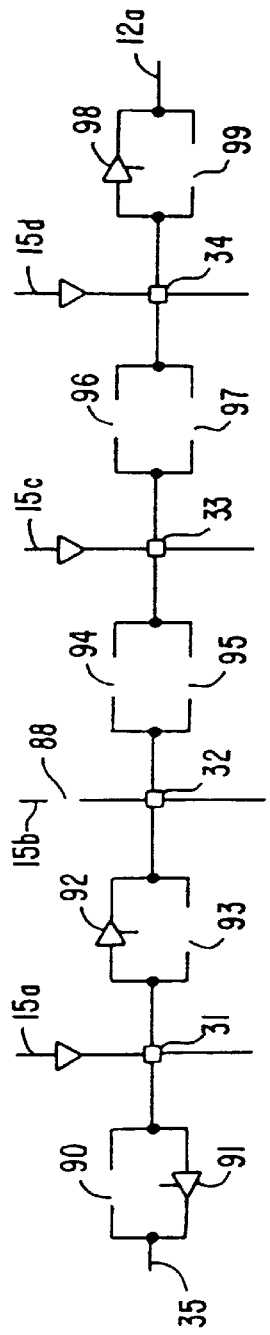
FIG. 8c illustrates a bus line which has been segmented using the controllable driver circuits.

FIGS. 8a, 8b, and 8c illustrate a refinement in the routing structure of our system. In the preferred embodiment of our system, the buses are unidirectional. Absent other modifications, this imposes a requirement on the system, if it to have maximum flexibility, buses in each direction. For example, input bus 12 would be required to have some lines with driver circuits to allow signal propagation to the east, and some lines with driver circuits to allow signal propagation to the west. FIG. 8a illustrates an example, with bus line 12a propagating signals to the right, and bus line 12b propagating signals to the left.

FIG. 8b shows a modification of this technique in which controllable driver circuits are used to segment the bus line 12a into smaller regions, thereby allowing portions of the line to be used in each direction. As shown in FIG. 8b, some of the output buses 15a, 15b, 15c, and 15d cross the input bus 12a at junction locations 31, 32, 33, and 34. Each of these junction locations will use the connection structure shown in FIG. 7 to provide a possible interconnection between the output bus line 15 and the input bus line 12. Unlike the structure of FIG. 8a, however, a pair of controllable driver circuits is provided between each junction. For example, drivers 92 and 93 are provided between junctions 31 and 32. By programming one of the driver circuits ON and the other one OFF, signals can be propagated between nodes 31 and 32 in either direction.

FIG. 8c provides an example. In FIG. 8c, assume that the signal on line 15a is to be communicated both to the left and right on input bus 12a. To achieve this, circuits 91 and 92 are programmed ON, and circuits 90 and 93 are programmed OFF. This allows the signal on line 15a to be supplied to nodes 35 and 32. For illustration, circuit 88 has been programmed OFF to show that the same bidirectional capability may be provided in the output lines, as well as the input lines.

Driver circuits 94, 95, 96, and 97 have all been programmed OFF to isolate node 32 from node 34. Of course, the node could be isolated by programming only one pair 94 and 95, or 96 and 97 OFF. To enable the signal on output bus 15d to be supplied to the right on input line 12a, circuit 98 has been programmed ON and circuit 99 OFF.

Figure 9:
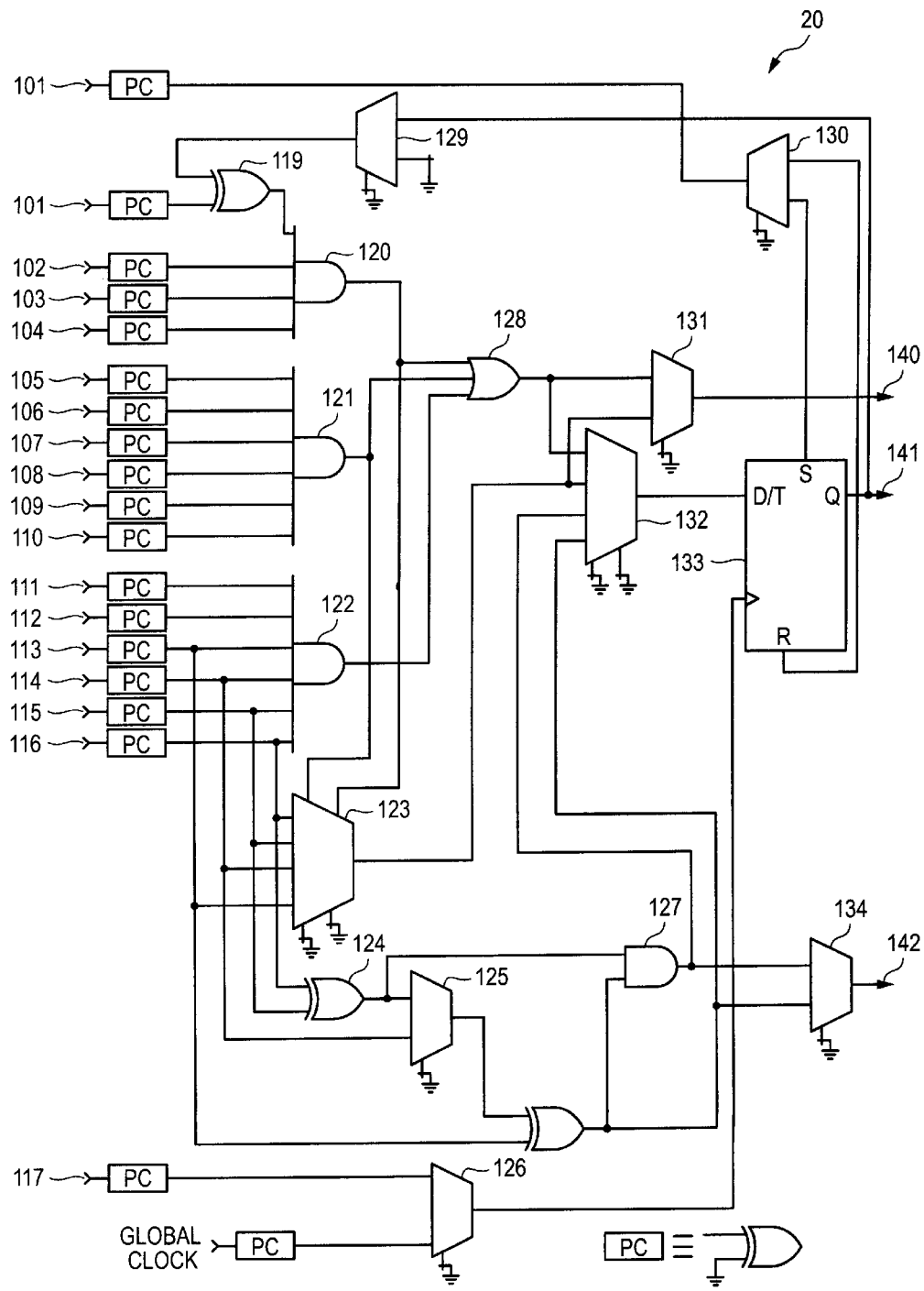
FIG. 9 is a schematic drawing of the circuitry of one logic cell.

FIG. 9 is a schematic diagram of a preferred embodiment of the logic cell employed in our system. As described in conjunction with FIG. 1, the logic cells are used to perform the logical operations on the input signals from the input buses, and place the resulting output signals on the output buses for use by other cells, or to be supplied by the integrated circuit to other electronic apparatus.

As shown in FIG. 9, in the preferred embodiment a logic cell 20 may receive up to 18 input signals 100, 101, ..., 117, and provide in response three output signals 140, 141, and 142. By virtue of the exclusive OR gate 119, the AND gates 120, 121, and 122, and the OR gate 128, combinational logic may be performed. The D-type flip-flop 133 provides the capability of performing sequential logic on the input signals, or on the output signals from the combinational logic, depending upon the state of multiplexer 132.

In FIG. 9 each input signal is supplied through a polarity control (PC) circuit formed using an exclusive OR gate, as shown in the lower right-hand portion of the figure. The rectangular symbol with "PC" inside it designates this polarity control connection, and is used to simplify the drawing.

The particular logic cell depicted allows for global or local clock options, enabling the clock rate of the logic cell to differ from the clock rate of the overall integrated circuit. By virtue of the programmable interconnections, unused circuits consume no power, yet polarity control is provided on all inputs.

The particular logic cell depicted is optimized to implement, and function such as a full adder with carry, a two-bit comparator, or a four-input multiplexer. In addition, the logic can readily serve as a single stage of a preloadable left/right shift register, or as one stage of a synchronous four-bit preloadable up/down counter.

Figure 10:
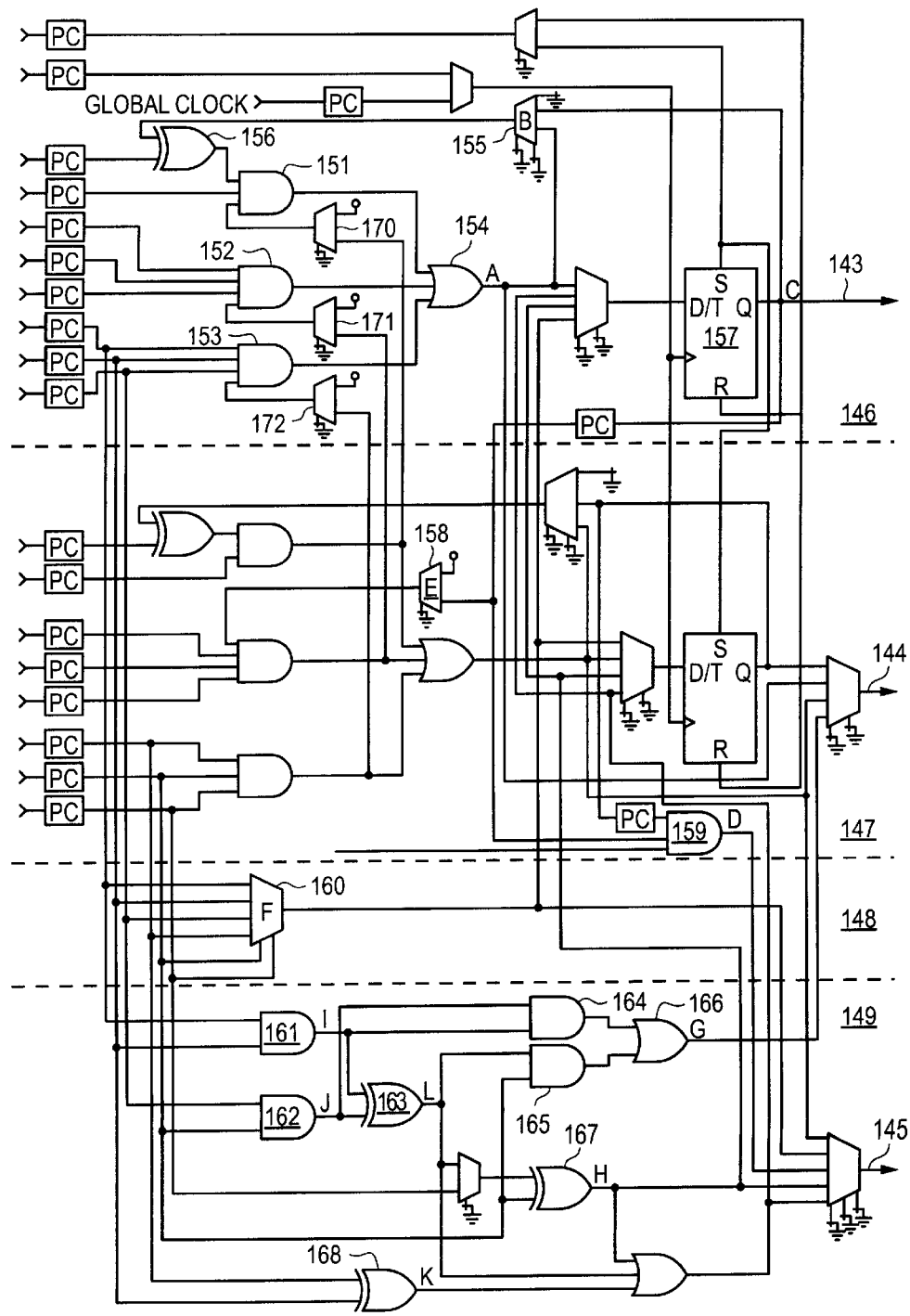
FIG. 10 is a detailed circuit schematic of a preferred embodiment of the logic block employed in FIG. 1.

FIG. 10 is a detailed circuit schematic of a preferred embodiment of the logic block employed in the programmable logic architecture of this invention. The logic block schematic corresponds to a preferred embodiment of the logic block 20 shown in block diagram form in FIG. 1. Generally, the logic block is coupled to potentially, depending on the programming, receive up to eighteen input signals at the terminals along the left edge of the Figure. In response the logic block supplies up to three output signals at the terminals 143, 144, and 145 along the right edge of the Figure. For the purpose of explanation, the logic block can be considered as being divided into four sections as shown by the dashed lines extending across FIG. 10. The upper two sections 146, 147 provide high level functions, as described below. The third section 148 provides a multiplexing function, and the bottom section 149 an arithmetic and comparing function. The bottom section adder can provide a carry to the top section, or permit the comparison of three bits to detect whether all are the same.

In the upper section 146, logic gates 151, 152, 153, and 156 provide AND-OR logic to node A. Feedback from some of the gates in section 147 is permitted by the multiplexers 170, 171, 172. This enables supplying of some of the input signals directed to the section 147 to section 146, as well. Multiplexer 155 provides a feedback multiplexer, enabling, in combination with gate 156, a latch function to be provided. The feedback path from flip-flop 157 provides a load function for a counter or a shifter. The flip-flop itself provides a path for controlling data flow from the logic block to external circuitry. When the flip-flop is configured as a D-type flip-flop, it provides for shifting. When configured as a T-type flip-flop, it provides counting capability.

The second section 147 of the logic block duplicates the functionality of the upper section, and is linked to the upper section by node C through multiplexer 158 and AND gate 159. By programmable coupling the upper two sections of the logic block together, the overall logic block can provide a two-bit counter. This counter can be chained together with other counters provided by other logic blocks to make long counters. The connection at node C allows the upper unit to shift data to the lower unit.

The third section 148 of the logic block, consisting primarily of multiplexer 160, can be programmed to provide a straight multiplexing function on a subset of the input signals.

In the lower section 149 of the logic block, gates 161, 162, 163, 164, 165, 166, and 167 enable provision of a full adder with a carry bit at node G. The sum appears at node H. Gates 161 and 162 allow multiplexing, while gates 163, 168, and 167 allow comparison of three-bit quantities.

Throughout FIG. 10 small rectangles labeled PC provide polarity control on the signal, using the gate structure shown in the inset of FIG. 9. Also, as shown, each multiplexer in the logic block is connected to be controlled by one or two control bits. These can be either logical 1 or logical 0, thereby providing a one or two bit control signal to the multiplexer to enable selection of one of two, or one of four input lines to the multiplexer. The selected line is coupled to the output terminal of the multiplexer.

The logic block shown in FIG. 10 enables relatively easy construction of a set of logic functions. In contrast to the approach followed by other programmable logic device architectures, this architecture is optimized to provide various functions, rather than provide overall complete flexibility and functionality. By providing a relatively large logic block, fewer connections are required and faster overall operating speed is provided. In other architectures, the provision of numerous small logic blocks results in many interconnections among blocks, slowing overall system speed.

Figure 11:
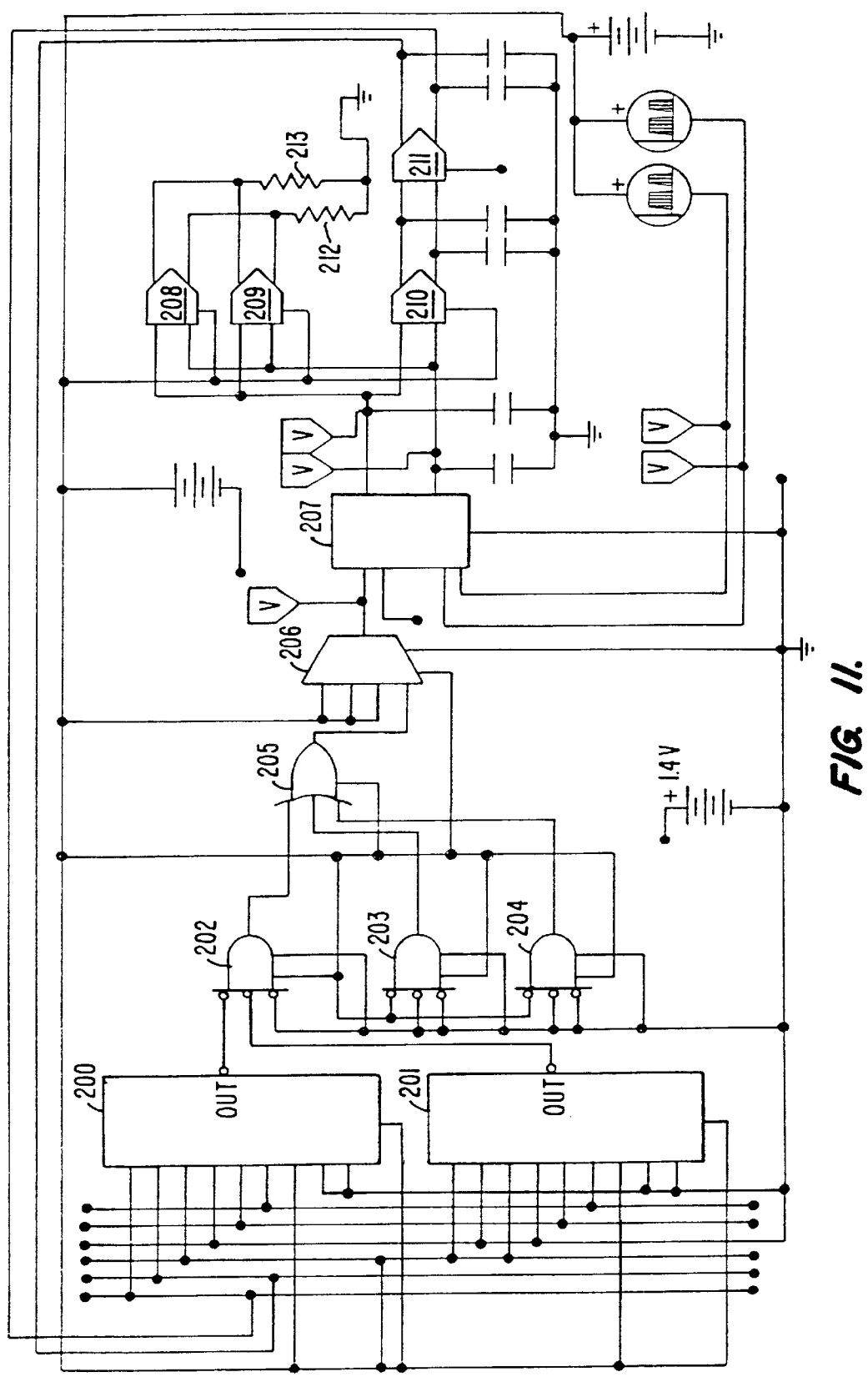
FIG. 11 is a block diagram of a small portion of the overall programmable logic device chip shown in block form in FIG. 1.

FIG. 11 is a block diagram of a small portion of the overall programmable logic device chip shown in block form in FIG. 1. Shown along the left-hand edge of FIG. 11 is a series of lines labeled "vertical channel." These lines are the input routing channels or bus 12 described in the earlier figures. The multiplexers 200, 201, coupled to the input bus include the circuitry that allows connections from the routing channel 12 to the input of the logic block, as well as the circuits used to create the input polarity control function described above. The logic block is shown to the right of the multiplexers 200, 201.

The next three portions of the schematic, consisting of the AND gates 202, 203, and 204, the OR gate 205, and multiplexer 206, represent the AND-OR-multiplexer chain shown at the upper portion of FIG. 10—the logic block diagram. The flip-flop 207 represents the flip-flop and the circuitry necessary to create an output to drive one line of bus 15. The next four blocks 208, 209, 210, and 211 on the diagram are unidirectional repeaters. Only four shown in the diagram, however, clearly any desired number may be employed. These repeaters are the repeaters that would be used to make gates 53, 62, 65, 67, 70, 71, 80, 82, 83, or 84, etc. For illustration, resistors 212 and 213 are shown coupled to repeaters 208 and 209, representing loads which those repeaters would drive in the form of other circuitry. The resistors themselves are not fabricated on the chip. Repeaters 210 and 211 drive the feedback path back to the vertical channel 12. Thus they represent supplying an output signal to an input bus, such as is shown in FIG. 7 at node 82.

Although the foregoing has been a description of the preferred embodiment of the programmable logic of our system, it should be appreciated that numerous variations in the specific details and structures described can be implemented. Accordingly, the scope of the invention is set forth by the appended claims.

What is claimed is:

1. A routing structure for interconnecting logic cells in a programmable logic circuit, comprising:

a plurality of first signal lines extending in a first direction among the logic cells;

a plurality of second signal lines extending in a second direction among the logic cells, the second direction not parallel to the first direction, the first and second signal lines crossing in a plurality of function regions;

in each function region, a plurality of reprogrammable active driver circuits coupled between the first signal lines and the second signal lines for selectively disconnecting the first signal lines from the second signal lines, selected ones of the reprogrammable active driver circuits having output nodes directly driving selected ones of the second signal lines; and a plurality of additional controllable active driver circuits coupled between selected ones of the first signal lines and the controllable active driver circuits for amplifying signals on the first signal lines before supplying the signals to the controllable active driver circuits.

2. A routing structure for interconnecting logic cells in a programmable logic circuit, comprising:

a plurality of first signal lines extending in a first direction among the logic cells;

a plurality of second signal lines extending in a second direction among the logic cells, the second direction not parallel to the first direction, the first and second signal lines crossing in a plurality of junction regions; and in each junction region, a plurality of reprogrammable active driver circuits coupled between the first signal lines and the second signal lines for selectively disconnecting the first signal lines from the second signal lines, selected ones of the reprogrammable active driver circuits having output nodes directly driving selected ones of the second signal lines, wherein the programmable logic circuit is embodied on an integrated circuit; and wherein the first signal lines extend in a serpentine manner on the integrated circuit.

3. A routing structure for interconnecting logic cells in a programmable logic circuit, comprising:

a plurality of first signal lines extending in a first direction among the logic cells;

a plurality of second signal lines extending in a second direction among the logic cells, the second direction not parallel to the first direction, the first and second signal lines crossing in a plurality of junction regions; and in each function region, a plurality of reprogrammable active driver circuits coupled between the first signal lines and the second signal lines for selectively disconnecting the first signal lines from the second signal lines, selected ones of the reprogrammable active driver circuits having output nodes directly driving selected ones of the second signal lines, wherein the programmable logic circuit is embodied on an integrated circuit; and wherein the second signal lines extend in a serpentine manner on the integrated circuit.

4. An input/output circuit for connecting input/output nodes to a routing structure in a programmable logic circuit having logic cells, the input/output circuit comprising:

an input/output pad;

a plurality of input lines for supplying signals to be processed by the logic cells, the input lines extending in channels between the logic cells;

a plurality of output lines distinct from the plurality of input lines, the output lines for receiving signals which have been processed by the logic cells, the output lines extending in channels between the logic cells;

a first plurality of controllable driver circuits disposed between the input/output pad and each one of the plurality of input lines for selectively and directly connecting the input/output pad to the input lines; and a second plurality of controllable driver circuits disposed between the input/output pad and each one of the plurality of output lines for selectively and directly connecting the input/output pad to the output lines.

* * * * *